United States Patent [19]

Matsumoto et al.

[11] Patent Number: 5,493,509

[45] Date of Patent: Feb. 20, 1996

[54] METHOD OF AND APPARATUS FOR GENERATING MASK LAYOUTS

[75] Inventors: Nobu Matsumoto; Shojiro Mori, both of Yokohama, Japan

[73] Assignee: Kabushiki Kaisha Toshiba, Kawasaki, Japan

[21] Appl. No.: 115,144

[22] Filed: Sep. 2, 1993

[30] Foreign Application Priority Data

Sep. 22, 1992 [JP] Japan .................................. 4-253183

[51] Int. Cl.$^6$ ..................................................... G06F 17/50
[52] U.S. Cl. ............................................ 364/491; 364/490
[58] Field of Search .................................. 364/488, 489, 364/490, 491

[56] References Cited

U.S. PATENT DOCUMENTS

| | | | |
|---|---|---|---|
| 5,079,717 | 1/1992 | Mina | 364/490 |
| 5,267,177 | 11/1993 | Sato et al. | 364/491 |
| 5,303,161 | 4/1994 | Burns et al. | 364/490 |
| 5,353,235 | 10/1994 | Do et al. | 364/491 |
| 5,369,596 | 11/1994 | Tokumaru | 364/491 |
| 5,381,343 | 1/1995 | Bamji et al. | 364/488 |

OTHER PUBLICATIONS

"Compaction Based Custom LSI Layout Design Method"by Ishikawa et al., IEEE ICCAD-85, Nov. 18–21, 1985, pp. 343–345.
"A Hierarchical Routing System for VLSIs Including Large Macros" by Hinatashi et al., IEEE 1986 Custom Integrated Circuits Conference, May 12–15, 1986, pp. 285–288.
"Rectilinear Area Routing: A Channel Router Approach" by Hudson et al., IEEE ICCD 1985, pp. 468–471.
"IC Mask Layout With A Single Conductor Layer", Akers et al., IEEE 1970, pp. 7–16.
"A Parallel Processing Approach for Logic Module Placement" by Ueda et al., IEEE Trans. on Computer–Aided Design, vol. CAD-2, No. 1, Jan. 1983, pp. 39–47.
"A Placement Algorithm for Array Processors" by Chyan et al., IEEE 20th Design Automation Conference, 1983, pp. 182–188.
"Algorithmic Aspects of One–Dimensional Layout Compaction" by Doenhardt et al., IEEE Trans. On Computer–Aided Design, vol. CAD-6, No. 5, Sep. 1987, pp. 863–878.
"Globally Optimum Compaction of Layout Hierarchies" by D. Marple, 1990 preprint of document A Hierarchy Preserving Hierarchical Compactor.
"A Hierarchical Compactor"by D. Marple, 27th ACM/IEEE Design Automation Conference, 1990, pp. 375–381/
"An Algorithm to Compact a VLSI Symbolic Layout With Mixed Constraints" by Liao et al., IEEE Trans. on Computer–Aided Design of Integrated Circuits and Systems, vol. CAD-2, No. 2, Apr. 1983, pp. 62–69.
"Physical Design Automation of VLSI Systems" Edited by B. T. Preas et al., Benjamin/Cummings Publishing Company, Chapter 6, pp. 211–267 and 274–281.
"Symbolic Layout Compaction Review" by D. C. Boyer, 25th ACM/IEEE Design Automation Conference, 1988, pp. 383–389.
"Datapath Generator Based on Gate–Level Symbolic Layout", Matsumoto et al., Proc. 27th ACM/IEEE Design Automation Conference, pp. 383–388, 1990.

*Primary Examiner*—Vincent N. Trans
*Attorney, Agent, or Firm*—Finnegan, Henderson, Farabow, Garrett & Dunner

[57] ABSTRACT

In graphic data representing a symbolic layout for a semiconductor integrated circuit, a plurality of first cutting lines and a plurality of second cutting lines crossing the first cutting lines at right angles are set. First, the graphic data is cut along said first cutting lines to produce a plurality of first segment data items. These first segment data items are each compacted in the direction of the second cutting line. These compacted first segment data items are connected according to the first cutting lines. This connected first segment data is cut along the second cutting lines to produce a plurality of second segment data items. These second segment data items are each compacted in the direction of the first cutting line. These compacted second segment data items are connected to one another to produce a compacted mask layout.

18 Claims, 4 Drawing Sheets

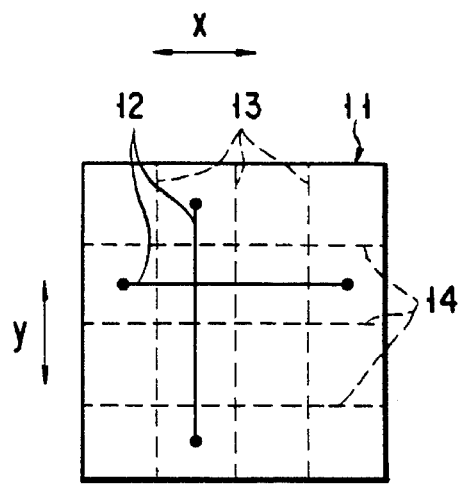
F I G. 1A
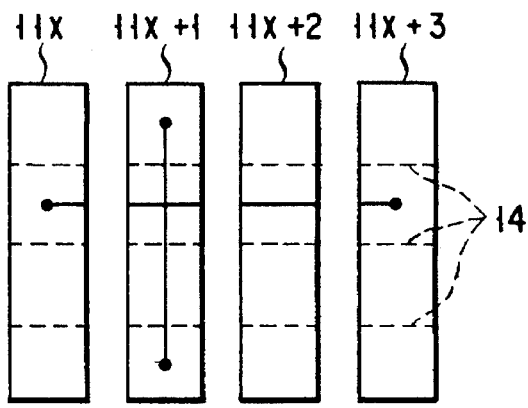
F I G. 1B
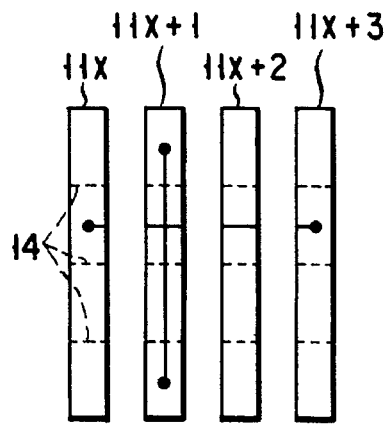
F I G. 1C
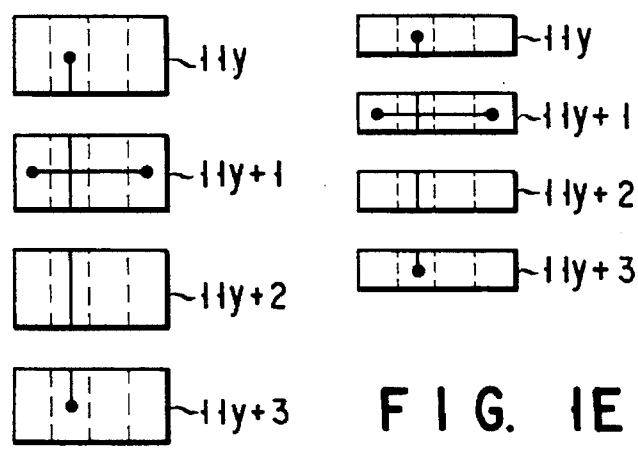
F I G. 1D   F I G. 1E
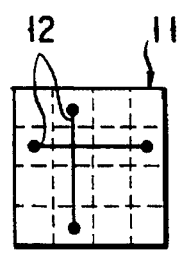
F I G. 1F
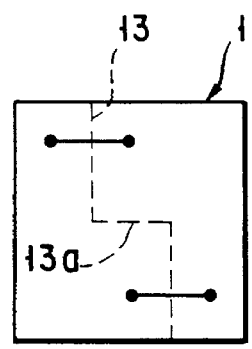
F I G. 2

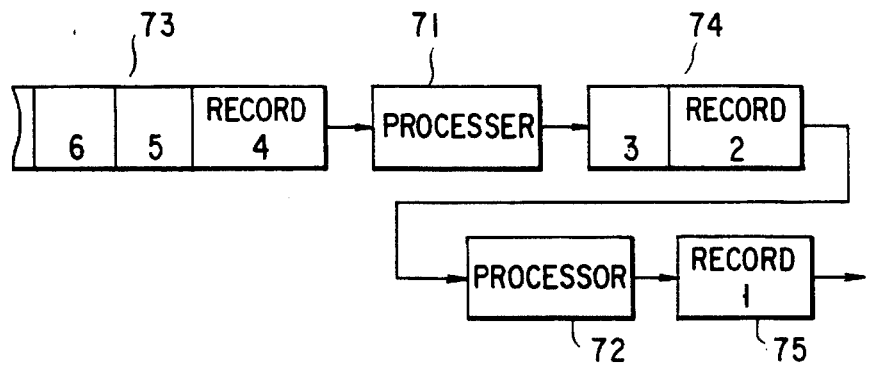
FIG. 7
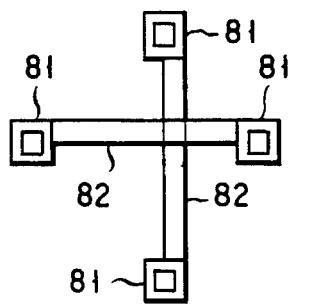
FIG. 8A
(PRIOR ART)
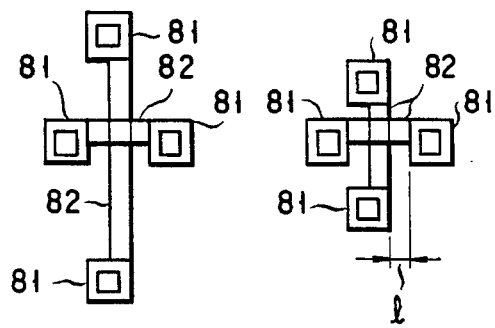
FIG. 8B
(PRIOR ART)
FIG. 8C
(PRIOR ART)
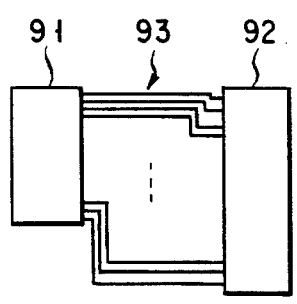
FIG. 9 (PRIOR ART)
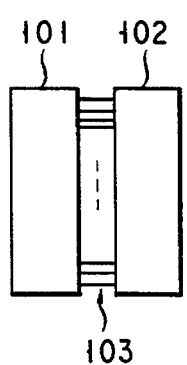
FIG. 10 (PRIOR ART)

METHOD OF AND APPARATUS FOR GENERATING MASK LAYOUTS

BACKGROUND OF THE INVENTION

1. Field of the Invention

This invention relates to a method of and apparatus for generating mask layouts (also called mask patterns) using, for example, computer-aided design (CAD), and more particularly to a compaction method and apparatus for symbolic layouts.

2. Description of the Related Art

A layout of an integrated circuit as shown in FIG. 8A is generally called a symbolic layout because it is expressed by symbols. Compaction or spacing techniques for such symbolic layouts involve shortening the distance between symbols as possible as design rules permit to produce a high packing-density layout or generate a layout meeting the design rules from a layout not meeting the design rules. Specifically, with these techniques, components including contact symbols 81 and wires 82 are compacted by moving them as shown in FIGS. 8B and 8C, so that the distance 1 between contact symbols 81, 81 may be shortened according to design rules as shown in FIG. 8C.

The compaction is broadly divided into two-dimensional compaction whereby components are moved two-dimensionally and one-dimensional compaction whereby components are moved one-dimensionally in each direction of x and y. Since two-dimensional compaction requires a huge amount of processing time, it is not in common use. For this reason, one-dimensional compaction is generally used. FIG. 8B shows the result of one-dimensional compaction of the FIG. 8A layout in the x-direction. As seen from FIG. 8B, with one-dimensional compaction, one compaction allows only either the x or the y coordinates of the components to change but prevents the other coordinates from changing.

The one-dimensional compaction is further classified into three methods: a shear line method (or known as a compression ridge method), a virtual grid method, and a constraint graph method (or known as a relative grid method). Among them, the constraint graph method is the most widely used. The technical aspects of these methods are well known, so that their explanation will be omitted.

The compaction described above, however, have the problem that they cannot process a huge amount of data, or an enormous amount of symbolic layouts. The reason for this is that although the amount of computer resources used in compaction processing, especially the frequency of use of the main memory increases as the size of an integrated circuit to be processed becomes larger, there is a limit to the capacity of the main memory. Therefore, all the chips on a large-scale integrated circuit cannot be compacted in unison.

Dependence of software performing compaction, or a compactor, on the circuit size is lower than order (n) (hereinafter, referred to as O(n)). Thus, if the dependence is O(f(n)), the upper limit of the circuit size allowing compaction is not so large. Specifically, when an ordinary design-supporting apparatus, for example, an engineering work station (EWS) with a main memory of the order of 32 MB, is used, the maximum size of an integrated circuit that a conventional compactor using the constraint graph method can handle at a time is a size containing approximately 10,000 transistors. Here, the value contains an error of the order of units. At present, large-scale integrated circuits contain several hundred thousand transistors. Thus, 10,000 transistors are much fewer in number than the several hundred thousand transistors.

As described above, since it is difficult to process a large-scale integrated circuit at a time using a conventional compactor, a hierarchically processing method has been proposed. As this hierarchically processing method, a bottom-up method and a pitch matching method are well known. The bottom-up method is such that a symbolic layout is divided into segments 91 and 92 as low-level hierarchical data items as shown in FIG. 9, and after these segments 91 and 92 are subjected to compaction, the connection terminals of the respective segments 91 and 92 are connected to one another with wires 93.

The pitch matching method is such that a symbolic layout is divided into segments 101 and 103 and these segments 101 and 103 undergo compaction, taking into account the pitch of wires connecting the segments 101 and 102.

The first problem of the hierarchically processing method is that compaction between different hierarchies or between different blocks in the same hierarchy is insufficient, that is, an area loss takes place. For example, in the case of the bottom-up method of FIG. 9, a wasteful wiring area develops. The second problem is implementation is complex and difficult and consequently a practical system has not been placed on the market yet.

Another problem with conventional compaction methods is that it is difficult to predict the performance or the result of the compaction processing. Particularly, conventional methods introduce the danger of permitting a relative position between symbols to be displaced much from the original position. If this happens, the delay time in the wire will increase more than expected. Thus, it is difficult to predict the performance of the chip unless steps are taken to prevent the displacements of the symbols.

Further, the inventor of this application has disclosed a compaction method in the literature: Proc. 27th ACM/IEEE Design Automation Conference pp. 388–393. The technique disclosed in the literature is related to a compaction method of a logic gate integrated circuit where the control lines for supplying control signals are arranged perpendicularly to data lines for supplying data, or a compaction method of data paths. In this compaction method, the input data to the symbolic layout has been previously divided so as to form a hierarchy, which restricts description of input data, resulting in lack of versatility.

SUMMARY OF THE INVENTION

The object of the present invention is to provide a versatile method and apparatus for generating mask layouts which, using an ordinary design-supporting apparatus, enable not only compaction of large-scale integrated circuits, but also suppression of loss of the chip area.

The foregoing object is accomplished by providing a method of generating mask layouts for semiconductor integrated circuits using a design-supporting apparatus, comprising the steps of: reading data representing a symbolic layout for a semiconductor integrated circuit stored in a first memory device and storing the data in a second memory device, the data containing a plurality of first cutting lines and a plurality of second cutting lines crossing the first cutting lines at right angles; cutting the data read from the second memory device along the first cutting lines to produce a plurality of first segment data items; compacting these first segment data items in the direction of the second cutting line; connecting all these compacted first segment data items according to the first cutting lines; cutting the connected first segment data along the second cutting lines to produce a plurality of second segment data items; compacting these second segment data items in the direction of the first cutting line; and connecting these compacted second segment data items to each other and storing the resulting data in the first memory device.

The foregoing object is also accomplished by an apparatus for generating mask layouts for semiconductor integrated circuits, comprising: first memory means for storing data representing a symbolic layout for a semiconductor integrated circuit, the data containing a plurality of first cutting lines and a plurality of second cutting lines crossing the first cutting lines at right angles; first generating means for reading the data from the first memory means and cutting the data along the first cutting lines to produce a plurality of first segment data items; first compacting means for compacting the first segment data in the direction of the second cutting line; first connecting means for connecting the first segment data items compacted by the compacting means according to the first cutting lines; second generating means for cutting the connected first segment data along the second cutting lines to produce a plurality of second segment data items; second compacting means for compacting the second segment data items in the direction of the first cutting line; and second connecting means for connecting the second segment data items compacted by the second compacting means.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A through 1F show an embodiment of the present invention with a view to explaining its principle;

FIG. 2 is an explanatory diagram for a modification of the embodiment;

FIG. 7 is a block diagram of a pipeline system as another modification different from the compaction processing of the first embodiment;

FIGS. 8A through 8C are diagrams for explaining the concept of compaction;

FIG. 9 is an explanatory diagram for compaction by a conventional bottom-up method; and FIG. 10 is an explanatory diagram for compaction by a conventional pitch matching method.

DETAILED DESCRIPTION OF THE PREFERRED EMBODIMENTS

Hereinafter, referring to the accompanying drawings, embodiments of the present invention will be explained.

First, the principle of a mask layout method of the present invention will be described.

FIG. 1A shows a symbolic layout to be processed. In the symbolic layout, wires 12 are provided and a plurality of vertical cutting lines 13 for cutting the symbolic layout 11 in the y-direction and a plurality of horizontal cutting lines 14 for cutting the symbolic layout in the x-direction are defined. In this compaction, first, the symbolic layout 11 is cut along vertical cutting lines 13 into segments $11_x$ through $11_{x+3}$ as shown in FIG. 1B.

Then, the segments $11_x$ through $11_{x+}$ undergo one-dimensional compaction in the x direction by, for example, a constraint graph method, as shown in FIG. 1C. It should be noted that the height of the cut end of each wire 12 in each compacted segment remains unchanged. Thus, by connecting the segments $11_x$ through $11_{x+}$ to one another, the wires 12 are restored to their former state.

Next, after connecting the segments $11_x$ through $11_{x+}$ subjected to compaction, they are cut along the horizontal lines 14 into segments $11_y$ through $11_{y+3}$. The segments $11_y$ through $11_{y+}$ undergo one-dimensional compaction in the y direction by the same method as described above, as shown in FIG. 1E. After this, by connecting the segments $11_x$ through $11_{x+}$ subjected to compaction, the wires 12 are restored to their former state.

In the above procedure, it is possible to exchange vertical for horizontal and x for y to achieve the same processing. The vertical cutting lines 13 are not limited to straight lines. A line containing bends as shown in FIG. 2 may be used as long as it connects the upper end of the symbol layout to its lower end. The vertical cutting line 13 must not cross a symbol such as a contact or a transistor. The horizontal cutting line is defined as a line connecting the left end of the symbolic layout to its right end. As with the vertical cutting line, it may be a line containing bends as the vertical line may be.

Figure 3:
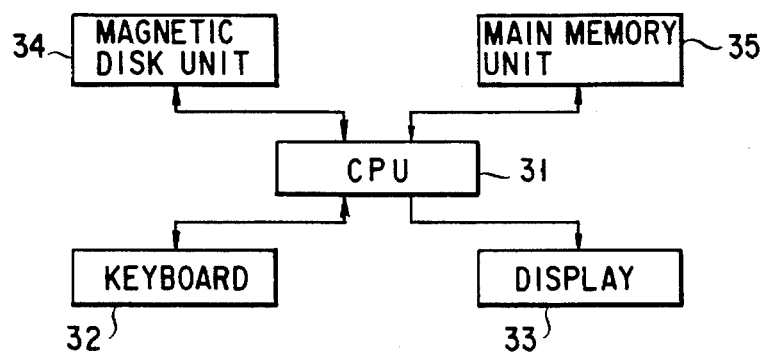
FIG. 3 is a block diagram of an embodiment of an apparatus used in the present invention.

FIG. 3 shows an embodiment of a design-supporting apparatus used in the present invention. This design-supporting apparatus is composed of an ordinary EWS. Specifically, a keyboard 32 for entering various types of information and a display 33 for displaying various types of data are connected to a CPU 31. Also connected to the CPU 31 are a magnetic disk unit 34 that stores graphic data representing symbolic layouts and programs including compactors, and a main memory unit 35 into which the programs are loaded for execution.

The symbolic layout stored in the magnetic disk, unit 34 is written according to Caltec Intermediate Format (CIF), the standard format. In the case of CIF, components composed of symbols including transistors:, contacts, and terminals, and wires are expressed by a statement (command). Here, a statement is made up of a record (1024 bytes). Each wire is broken down into a line having both ends before description. The vertical cutting lines and horizontal cutting lines for cutting the symbolic layout into segments are written in layers according to CIF grammar so as to be distinguishable from the other portions. For simplification, the vertical and horizontal cutting lines are assumed to be straight lines as shown in FIG. 1A.

Figure 4:
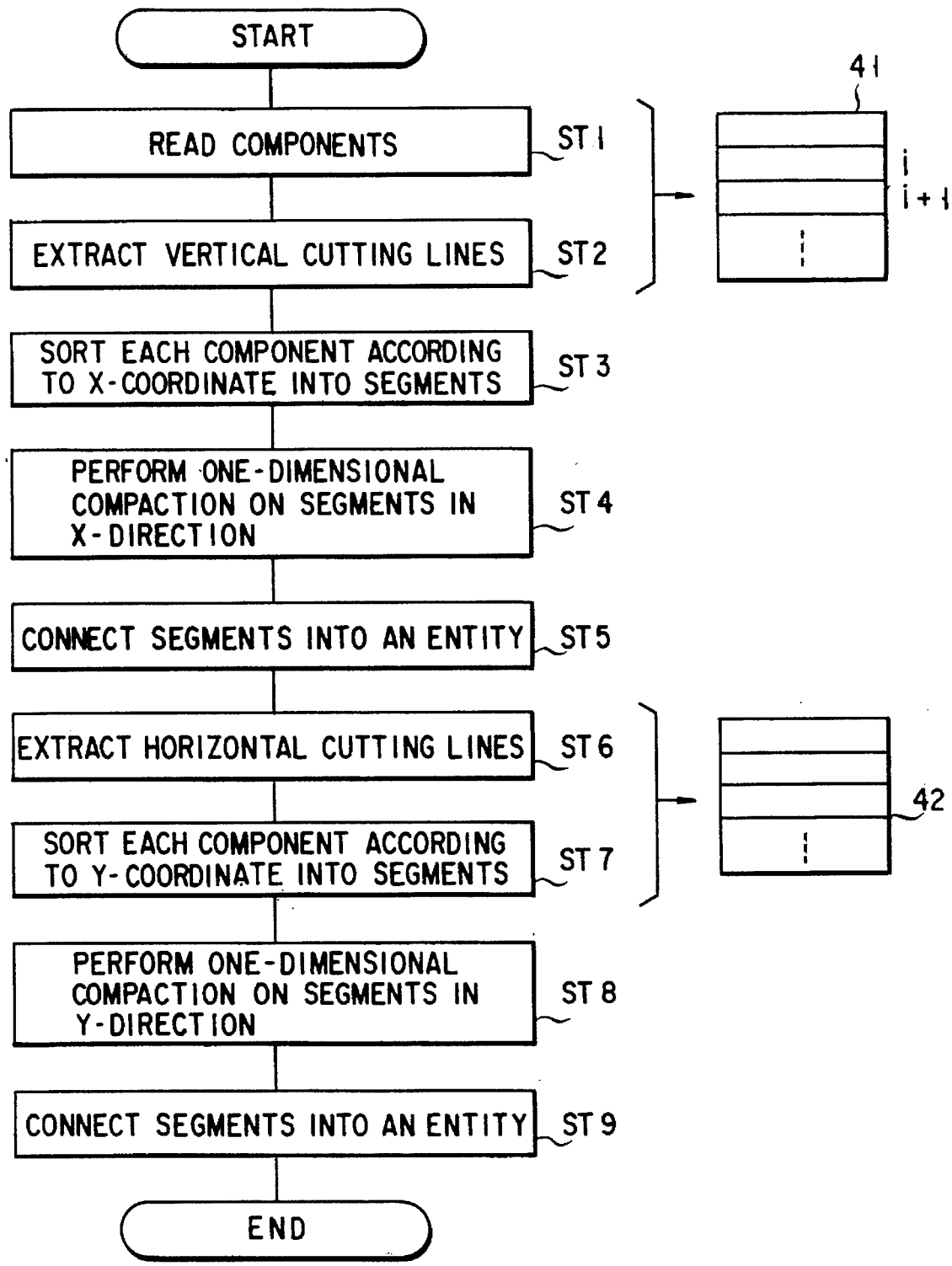
FIG. 4 is a flowchart for the operation of the apparatus of FIG. 3.

With the above principle and configuration, a mask layout method of the present invention will be explained, referring to a flowchart in FIG. 4.

First, pieces of data (graphic data) on the components are read one by one from the magnetic disk unit 34 into the main memory unit 35 (ST1). Only vertical cutting lines are extracted from each piece of data just read. Because the vertical cutting lines can be distinguished from the rest by their layer, only the x-coordinate data on the vertical lines is stored in, for example, a table 41 serving as a memory area provided in the main memory unit 35 (ST2). These pieces of the x-coordinate data almost correspond to the segments $11_x$ through $11_{x+3}$ shown in FIG. 1B. When more than one line has the same coordinates, only one of them is stored in the table 41. The pieces of the x-coordinate data stored in the table 41 are sorted sequentially.

Then, pieces of data on the individual components are read one by one from the main memory unit 35, and are sorted out according to the x-coordinates into the individual segments $11_x$ through $11_{x+3}$ serving as sets of records (ST3). Specifically, in the case of a symbol, when its reference point, for example, the x-coordinate of the center of the symbol, lies between the ith and (i+1)th pieces of the x coordinate data stored in the table 41, it is added to the (i+1)th segment. That is, the x-coordinate data on the symbol's center is stored in the (i+1)th of the table 41. This holds true for wires. When wires stretch over more than one segment, they are cut and the coordinate data on those cut portions is added to the corresponding segments. That is, terminals are produced at the cut ends and the coordinate data on the terminals is stored in the table. Next, the segments produced at step ST3 undergo one-dimensional compaction one by one in the x-direction by, for example, a constraint graph method (ST4). As a result, as shown in FIG. 1C, the individual segments $11_x$ through $11_{x+3}$ are compacted in the x-direction.

Then, the compacted segments are connected to each other as shown in FIG. 1D (ST5). That is, files written in stream format are tied together. At this time, unnecessary END commands contained in the file and the terminals produced at ST3 are eliminated.

Next, only horizontal cutting lines are extracted in a similar manner to ST1 from each component compacted in the x-direction, and only the y-coordinates of the horizontal lines are stored in, for example, a table 42 provided in the main memory unit 35 (ST6). Those y-coordinates almost correspond to the segments $11_y$ through $11_{y+3}$ shown in FIG. 1D. Then, pieces of data on the individual components are read one by one from the main memory unit 35, and are sorted out according to the y-coordinates into the individual segments $11_y$ through $11_{y+3}$ (ST7) in a similar manner to ST2. Next, the segments produced at step ST6 undergo one-dimensional compaction one by one in the y-direction by, for example, a constraint graph method (ST8). As a result, as shown in FIG. 1E, the individual segments are compacted in the y-direction.

Next, as shown in FIG. 1E, the compacted segments are connected to each other in a similar manner to ST5 (ST9). This process is achieved by increasing the y-coordinate of each segment by a constant value specified for each compacted segment before writing. In this way, a symbolic layout compacted in both the x- and the y-direction can be obtained. This compacted symbolic layout is stored in, for example, the magnetic disk unit 34.

The processing results at steps ST2, 3, 6, and 7 are stored in the table in the main memory unit 35. The results of processing at other steps ST4, 5, and 8 are also stored in, for example, the main memory unit 35, from which each result is read for subsequent processing.

Here, the time required for the above processes will be estimated. Each of steps ST3, ST5, ST6, ST7, and ST9 is the stream process of reading a single component such as a transistor or a contact, performing a specific process on it and writing the result into the tables 41 and 42. This process is carried out in records and requires a very small memory capacity, so that all the data can be stored in the main memory unit 35. Thus, the processing time of each step is determined by the size n of the circuit, or the upper limit independent of the number of records. As a result, the total processing time is O(n).

Steps ST4 and ST8 are for compaction of segment data. When each segment data is assumed to be almost the same in size and the number of segment data items be m, the processing time will be:

$O(f(n/m))$

Since these steps are repeated m times each, the total processing time will be:

$O(mf(n/m))$

When it is assumed that as the size n of the circuit becomes larger, the layout is cut into the more pieces, m will be approximately kn (where k is a constant). In this case, because f(n/m) is a fixed value independent of the size, the total processing time is O(n). Therefore, the processing time of this method is proportional to the size.

While in the above embodiment, at step ST4, the individual segments $11_x$ through $11_{x+3}$ are compacted in the x direction, and at step ST5, after those compacted segments are connected to each other, the resulting layout is cut along horizontal lines into segments $11_y$ through $11_{y+3}$, other approaches may be used.

Figure 5:
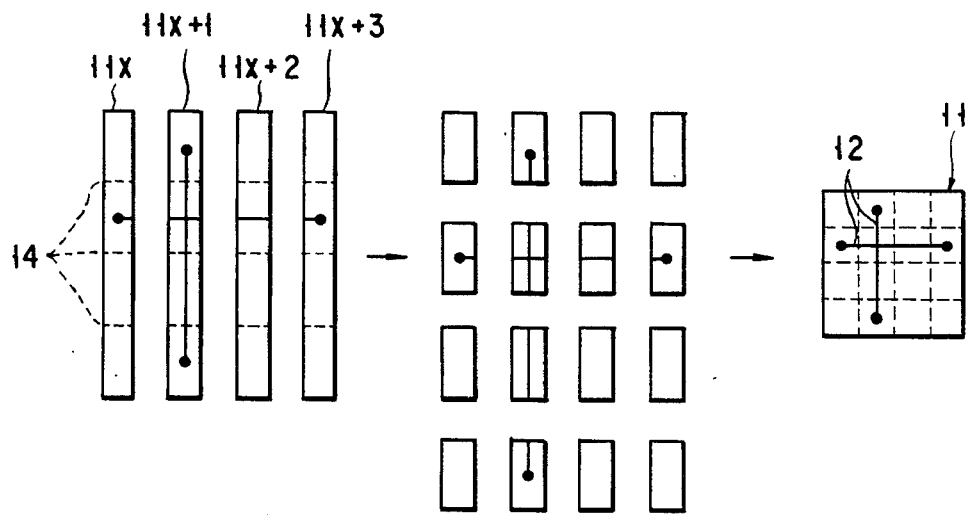
FIG. 5 is an explanatory diagram for the principle of a modification of the present invention.

In this connection, FIG. 5 shows a modification of the first embodiment. In this modification, after the individual segments $11_x$ through $11_{x+3}$ are compacted in the x direction at step ST4, these segments $11_x$ through $11_{x+3}$ are cut along horizontal lines 14 into segments without tying them together, and are compacted. Finally, these resulting segments are connected to one another.

In the above embodiment, nearly 95% of the processing time is spent on the compaction processing at steps ST4 and ST8. Thus, it is desirable to perform these processes in parallel.

Figure 6:
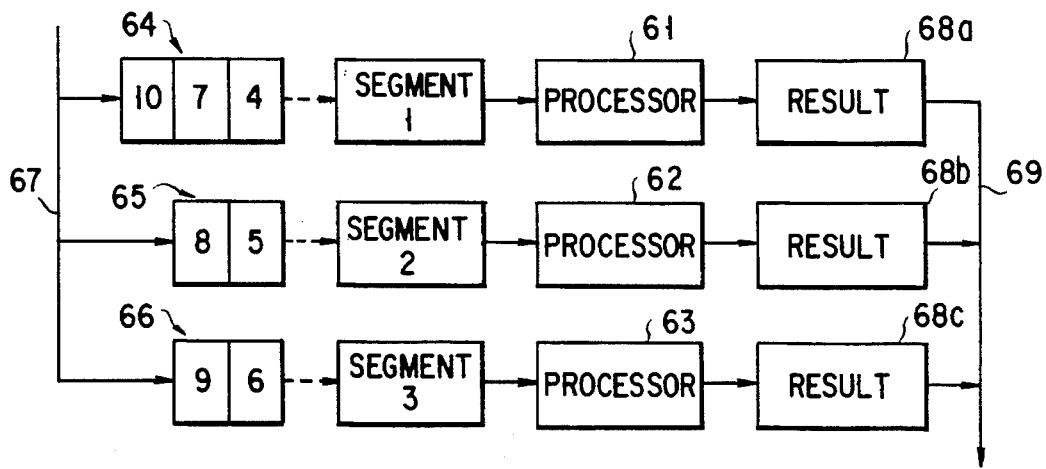
FIG. 6 is a block diagram of a parallel processing system as a modification of the compaction processing in the present invention.

FIG. 6 shows an example of parallel processing of compaction. This embodiment contains a plurality of processors 61, 62, and 63 for executing compaction. Queues 64, 65, and 66 composed of memories are connected to the processors 61, 62, and 63, respectively. The queues 64, 65, and 66 are connected to a network 67, through which segment data is supplied sequentially to the queues 64, 65, and 66. The segment data is stored in, for example, the magnetic disk unit 34, which outputs the stored segment data in sequence. Buffer memories 68a, 68b, and 68c are connected to the processors 61, 62, and 63, respectively. The buffer memories 68a, 68b, and 68c retain the compaction results from the processors 61, 62, and 63, respectively. The compaction results retained in the buffer memories 68a, 68b, and 68c are outputted to a network 69.

The segment data items corresponding to segments $11_x$ through $11_{x+3}$ or segments $11_y$ through $11_{y+3}$ are allotted equally to the processors 61, 62, and 63 and added to the corresponding queues 64, 65, and 66 via the network 67. Each segment data item corresponds to a job. The individual processors 61, 62, and 63 cause segment data items to undergo compaction one by one. The compaction results are transferred to, for example, the main memory unit 35 via the network 69.

The processes other than compaction, including the vertical cutting line-extracting process and sorting process at steps ST2 and ST6, the horizontal cutting line-extracting process and sorting process at steps ST4 and ST7, are stream processes, so that they can be carried out using a pipeline system.

FIG. 7 shows a pipeline system. A processor 71 executes the process of extracting vertical cutting lines or horizontal cutting lines, for example. A processor 72 executes the process of sorting out segments. So-called pipeline registers 73, 74, and 75 are provided at the input terminal of the processor 71, between the processor 71 and the processor 72, and at the output terminal of the processor 72, respectively. Records to be processed are stored in the registers 73 through 75. With this arrangement, the processing speed can be improved.

In the above embodiment, what undergo compaction at a time in the compaction process are segments of the symbolic layout. Thus, the smaller segments a symbolic layout is cut into, the larger a processible symbolic layout becomes. Therefore, when the number of segments is increased in proportion to the circuit size, there is theoretically no upper limit to the process. That is, a compaction process of large-scale circuits is possible. Since the circuit size that can be processed by a compactor using an existing constraint graph method contains approximately 10,000 transistors, for example, defining 100 vertical cutting lines and 100 horizontal cutting lines enable an existing design-supporting apparatus to process approximately one million transistors.

Because the processes other than compaction can be performed in the form of stream processing, there is no upper limit to the processing. Further, the processing time is O(n) as mentioned earlier, which is the best provided that there are no special conditions such as repetition.

Compaction of segment data items which spends most of the processing time can be performed independently of the other segment data items. Thus, each segment data item can be processed by a separate processor, so that increasing the number of processors enables a huge amount of data to be compacted in run time. Since an existing EWS can achieve compaction of 10,000 transistors in several tens of minutes to several hours, for example, use of 100 EWSs enables compaction of one million transistors in several tens of minutes to several hours. Further, it is possible to use inexpensive processors of high cost performance, which helps reduce the cost.

Because compaction is achieved after the symbolic layout is cut into segments, the moving range of symbols or the ends of wires due to compaction is restricted within the segment. Thus, the wires are not extended longer than expected, with the result that the length of the delay time in the wire can be determined, thereby making it possible to predict the performance of the chip.

Further, it is unnecessary for the input data on the symbolic layout to be of hierarchical structure previously divided as a conventional equivalent. Thus, description of the input data is not limited and consequently has flexibility.

What is claimed is:

1. A method of generating mask layouts for semiconductor integrated circuits using a design-supporting apparatus, comprising the steps of:

reading data representing a symbolic layout for a semiconductor integrated circuit stored in a first memory device and storing the data in a second memory device, the data containing a plurality of first cutting lines and a plurality of second cutting lines crossing the first cutting lines at right angles;

cutting the data read from said second memory device along said first cutting lines to produce a plurality of first segment data items;

compacting these first segment data items in the direction of the second cutting line;

connecting these compacted first segment data items according to the first cutting lines;

cutting the entire first segment data thus connected along the second cutting lines to produce a plurality of second segment data items;

compacting these second segment data items in the direction of the first cutting line; and connecting these compacted second segment data items to each other and storing the resulting data in said first memory device.

2. A method according to claim 1, wherein said first cutting lines are set in the vertical direction of the data.

3. A method of according to claim 1, wherein said second cutting lines are set in the horizontal direction of the data.

4. A method of according to claim 1, wherein said first and second cutting lines contain bends.

5. A method of according to claim 1, wherein said compaction is achieved in parallel by a plurality of processors in a manner that treats a single segment data item as a single job.

6. A method according to claim 1, wherein each of said compacting steps compacts each of said first and second segment data items by a constraint graph method.

7. A method of generating mask layouts for semiconductor integrated circuits using a design-supporting apparatus, comprising the steps of:

reading graphic data representing a symbolic layout for a semiconductor integrated circuit stored in a first memory device and storing the data in a second memory device, the data containing a plurality of first cutting lines and a plurality of second cutting lines crossing the first cutting lines at right angles;

cutting the data in said second memory device along said first cutting lines to produce a plurality of first segment data items;

compacting these first segment data items in the direction of the second cutting line;

cutting these compacted first segment data items along the second cutting lines to produce a plurality of second segment data items;

compacting these second segment data items in the direction of the first cutting line; and connecting these compacted second segment data items to each other and storing the resulting data in said first memory device.

8. A method of according to claim 7, wherein said second cutting lines cut the data horizontally.

9. A method of according to claim 7, wherein said first and second cutting lines contain bends.

10. A method of according to claim 7, wherein said compaction is achieved in parallel by a plurality of processors in a manner that treats a single segment data item as a single job.

11. A method according to claim 7, wherein said first cutting lines cut the data vertically.

12. An apparatus for generating mask layouts for semiconductor integrated circuits, comprising:

first memory means for storing data representing a symbolic layout for a semiconductor integrated circuit, the data containing a plurality of first cutting lines and a plurality of second cutting lines crossing the first cutting lines at right angles;

first generating means for reading said data from said first memory means and cutting the data along said first cutting lines to produce a plurality of first segment data items;

first compacting means for compacting said first segment data in the direction of the second cutting line;

first connecting means for connecting the first segment data items compacted by said compacting means according to the first cutting lines;

second generating means for cutting the connected first segment data along the second cutting lines to produce a plurality of second segment data items;

second compacting means for compacting said second segment data items in the direction of the first cutting line; and second connecting means for connecting the second segment data items compacted by said second compacting means.

13. An apparatus according to claim 12, wherein each of said first and second compacting means is equipped to compact said first and second segment data items using a constraint graph method.

14. An apparatus according to claim 12, wherein said first and second cutting lines contain bends.

15. An apparatus according to claim 12, wherein said first and second compacting means have each a plurality of processors and each processor performs parallel processing in a manner that treats a single segment data item as a single job.

16. An apparatus according to claim 12, wherein said first cutting lines are set in the vertical direction of the data.

17. An apparatus according to claim 12, wherein said second cutting lines are set in the horizontal direction of the data.

18. A method of generating mask layouts for semiconductor integrated circuits using a design-supporting apparatus, comprising the steps of:

reading data representing a symbolic layout for a semiconductor integrated circuit stored in a first memory device and storing the data in a second memory device, the data containing a plurality of first cutting lines and a plurality of second cutting lines crossing the first cutting lines at right angles;

cutting the data read from said second memory device along said first cutting lines to produce a plurality of first segment data items, each of said first segment data items being partitioned from each other;

compacting these first segment data items in a direction of the second cutting lines;

connecting these compacted first segment data items according to the first cutting lines;

cutting the entire first segment data thus connected along the second cutting lines to produce a plurality of second segment data items, each of said second segment data items being partitioned from each other;

compacting these second segment data items in a direction of the first cutting lines; and connecting these compacted second segment data items to each other and storing resulting data in said first memory device.

* * * * *